(12) United States Patent
Gonzalez et al.

(10) Patent No.: US 7,468,494 B2
(45) Date of Patent: Dec. 23, 2008

(54) REACTION ENHANCING GAS FEED FOR INJECTING GAS INTO A PLASMA CHAMBER

(75) Inventors: Juan Jose Gonzalez, Fort Collins, CO (US); Andrew Shabalin, Fort Collins, CO (US); Fernando Gustavo Tomasel, Fort Collins, CO (US)

(73) Assignee: Advanced Energy Industries, Fort Collins, CO (US)

( * ) Notice: Subject to any disclaimer, the term of this patent is extended or adjusted under 35 U.S.C. 154(b) by 0 days.

(21) Appl. No.: 10/355,632

(22) Filed: Jan. 31, 2003

(65) Prior Publication Data

US 2004/0149701 A1 Aug. 5, 2004

(51) Int. Cl.
*B23K 9/00* (2006.01)
(52) U.S. Cl. .............................. 219/121.51; 219/121.43; 219/121.41; 118/723 R; 156/345.33; 156/345.29
(58) Field of Classification Search ............. 219/121.51, 219/121.43, 121.48, 121.4, 121.41; 118/723 R, 118/723 I, 723 MW; 156/345.33, 345.29; 239/554, 555, 558
See application file for complete search history.

(56) References Cited

U.S. PATENT DOCUMENTS

| | | | | |
|---|---|---|---|---|
| 4,011,922 A | * | 3/1977 | Goplen | 181/272 |
| 4,557,879 A | * | 12/1985 | Weber | 261/122.1 |
| 5,997,589 A | * | 12/1999 | Tien | 29/25.01 |
| 6,388,226 B1 | | 5/2002 | Smith et al. | |
| 6,436,193 B1 | * | 8/2002 | Kasai et al. | 118/715 |
| 6,537,419 B1 | * | 3/2003 | Kinnard | 156/345.34 |
| 6,572,732 B2 | * | 6/2003 | Collins | 156/345.48 |
| 6,663,025 B1 | * | 12/2003 | Halsey et al. | 239/554 |

FOREIGN PATENT DOCUMENTS

JP 401054115 A * 3/1989

* cited by examiner

*Primary Examiner*—Mark Paschall
(74) *Attorney, Agent, or Firm*—Blakely Sokoloff Taylor & Zafman LLP

(57) ABSTRACT

In one aspect of the invention is a gas feed for injecting gas into a plasma-processing chamber that reduces the speed at which the gas interacts with the plasma discharge, so enhancing the stability of the plasma and the production of reaction products. In one embodiment, the gas feed comprises a gas speed reducer having apertures along its wall through which gas is distributed into the plasma chamber at a tangent to the chamber walls. In another embodiment, the gas feed comprises a gas speed reducer, which is made up of one or more channels such that, when traveling through the channels, the input and the output holes of the channels can only be connected by a broken line. In yet another embodiment, the gas speed reducer has a plurality of perforated sheaths, such that holes on one perforated sheath are not aligned with holes on another perforated sheath.

8 Claims, 4 Drawing Sheets

REACTION ENHANCING GAS FEED FOR INJECTING GAS INTO A PLASMA CHAMBER

BACKGROUND OF THE INVENTION

1. Field

Embodiments of this invention relate to the field of plasma chambers, and more specifically, to an apparatus for injecting gas into a plasma chamber that enhances the production of plasma reaction products.

2. Description of the Related Art

One of the areas in plasma processing that is commonly studied and troubleshooted is the topic of gas injection. Specifically, plasma chambers may experience "plasma wink out" failures during operation. Some of such failures can be attributed to the gas input configuration. Specifically, some gas input configurations are susceptible to wink out failures because they cause excessive perturbation of the plasma within the chamber. Also, some gas input configurations result in low degrees of dissociation of the input gas.

SUMMARY OF THE INVENTION

In one aspect of the invention is a gas feed for injecting gas that reduces the speed at which the gas enters a chamber. The gas feed includes a gas inlet through which gas enters, and a gas speed reducer that is attached to the gas inlet on one end, and has features for reducing speed of gas injected into the gas inlet.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION OF THE INVENTION

1. Overview

In one aspect of the invention is a gas feed that injects gas into a plasma processing chamber in a way that minimizes the perturbation caused to the plasma discharge by decreasing the speed at which the working gas interacts with the plasma discharge, thereby enhancing the production of reaction products. The gas feed comprises a gas speed reducer having a relatively low gas conductance. The low conductance produces a pressure drop that substantially reduces the pressure at the output of the gas speed reducer when compared to that measured on the gas feeding line. The reduced pressure at the output of the gas speed reducer results in a lower speed of the injected gas.

In one embodiment, the gas feed comprises a gas speed reducer having apertures along a sidewall through which gas is distributed into the plasma chamber at a tangent to the chamber walls. In another embodiment, the gas feed comprises a gas speed reducer, which is made up of one or more channels such that, when traveling through any of the channels, the centers of the input and output holes of the channels can only be connected by a broken line. In this context, channel is understood as a tubular conduit whose length is much larger than its diameter. In another embodiment, the gas feed comprises a gas speed reducer, which is made up of a stack of two or more perforated sheaths arranged such that the holes in consecutive sheaths are not aligned.

2. General Discussion

Figure 1:
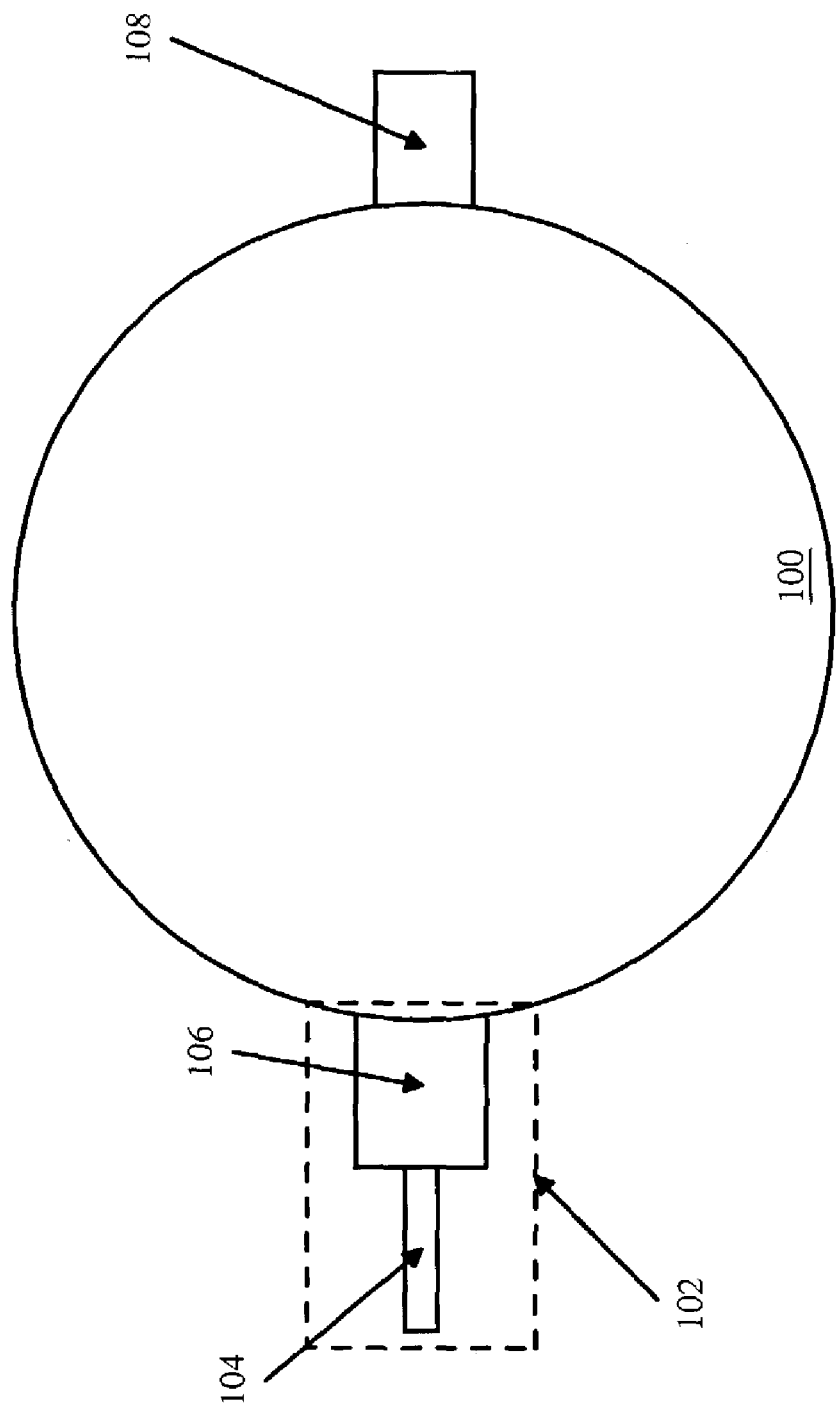
FIG. 1 illustrates a gas feed within general embodiments of the invention connected to a plasma chamber.
Figure 2:
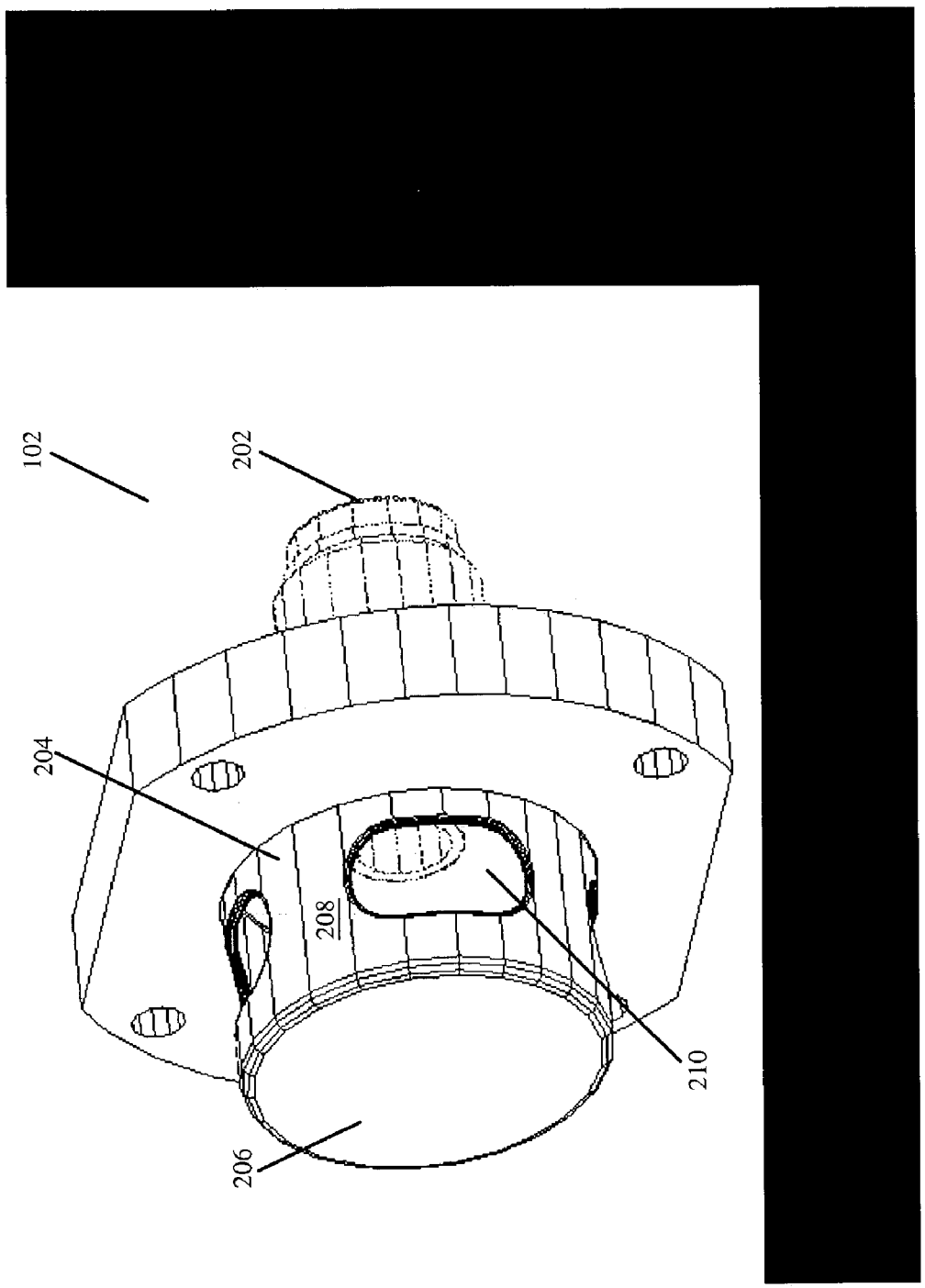
FIG. 2 illustrates a gas feed in accordance with a first embodiment of the invention.

FIG. 1 illustrates a gas feed 102 connected to a plasma source 100. As illustrated in FIG. 2, generally, the gas feed 102 comprises a gas inlet 104 through which gas is injected, and a gas speed reducer 106 for decreasing the speed at which the gas interacts with the plasma discharge. In certain embodiments, a gas feed 102 may additionally comprise one or more flanges for connecting the gas inlet 104 to the gas speed reducer 106. It should be understood by one of ordinary skill in the art that the gas feed 102 may comprise a separate and distinct gas inlet 104 and a separate and distinct gas speed reducer 106, or may integrate the gas inlet 104 and gas speed reducer 106 into a single component.

A working gas is injected into the plasma source 100 through the gas inlet 104 of the gas feed 102. The working gas, constantly fed into the chamber, is ionized and/or dissociated by the plasma discharge running within the chamber, and the products of the dissociation reaction are pumped out through the pumping port 108. As the working pressure within the plasma is much lower than the pressure in the gas feed line, in a direct injection gas feed, the working gas enters plasma chamber 100 in the form of a high-speed stream. The high-speed stream causes excessive perturbation to the plasma, increasing the likelihood that existing plasma will extinguish, and decreasing the dissociation rate of the gas.

In a first embodiment, gas is diffused through at least one aperture located on the wall of a gas speed reducer. As illustrated in FIG. 2, the gas feed 102 comprises a gas inlet 202 through which gas is injected, a gas speed reducer 204 having an end wall 206, a side wall 208, and at least one aperture 210 located on the wall 208. As one of ordinary skill in the art would recognize, gas inlet 202 is a specific embodiment of gas inlet 104, and gas speed reducer 204 is a specific embodiment of gas speed reducer 106.

In this embodiment, gas is injected into the gas inlet 202 and goes through the gas speed reducer 204. Having a lower conductance than a direct injection gas feed, the gas speed reducer 204 introduces a pressure drop that decreases the speed at which the input gas interacts with the plasma. The gas exits the gas speed reducer 204 and enters the plasma chamber 100 through the one or more apertures 210 located on the wall 208. In this embodiment, the working gas enters the plasma chamber 100 at a tangent to the chamber walls.

While the gas speed reducer 204 illustrated is cylindrical, and has a single wall, embodiments of the invention are not so limited. For example, the gas speed reducer 204 may be other than cylindrical.

Figure 4:
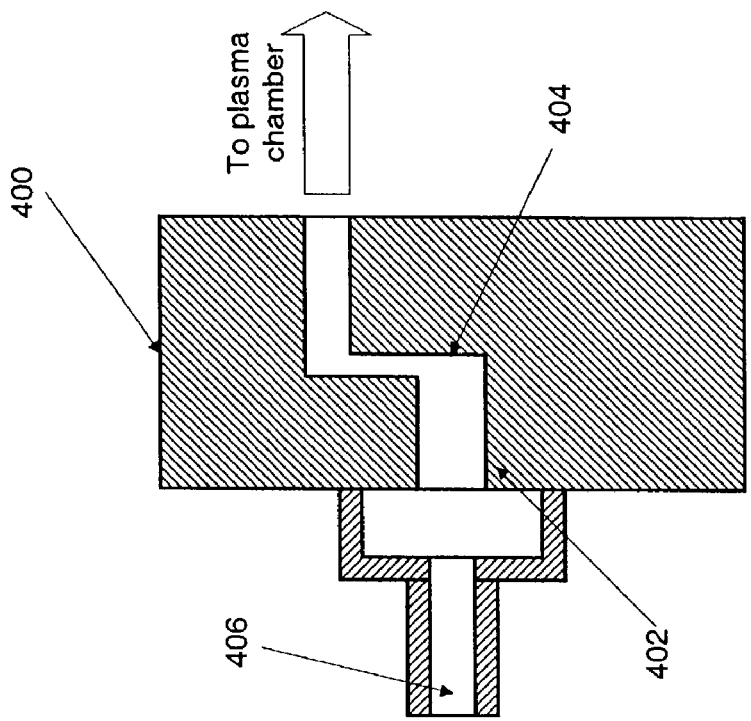
FIG. 4 illustrates another gas feed in accordance with the second embodiment of the invention.
Figure 3:
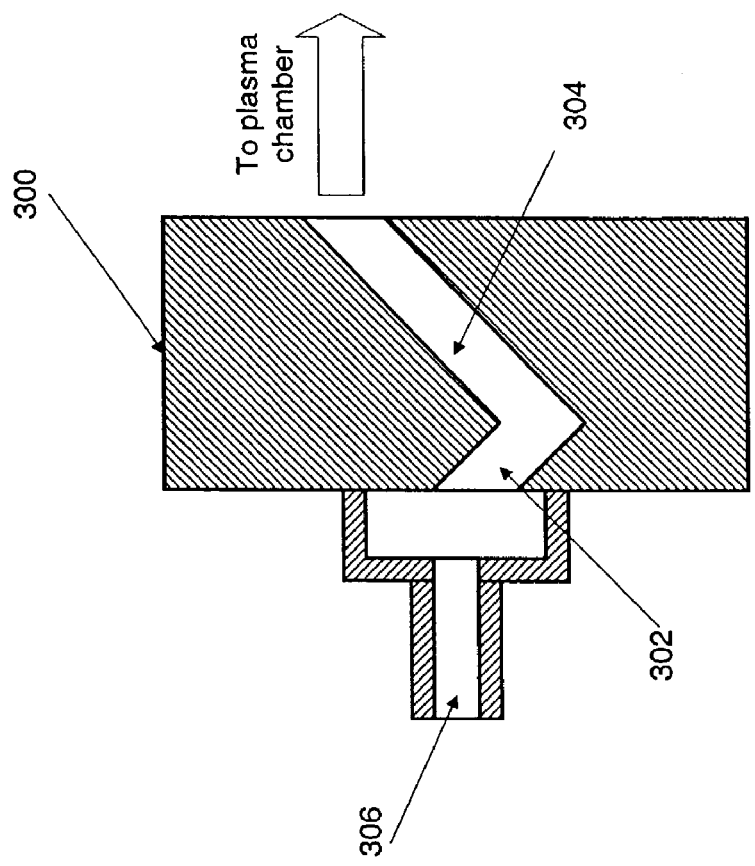
FIG. 3 illustrates a gas feed in accordance with a second embodiment of the invention.

In a second embodiment, the gas feed 102 comprises a gas speed reducer, which is made of a channel such that, when traveling through any of the channels, the center of the input and output holes of the channel can only be connected by a broken line. FIGS. 3 and 4 show two examples of such embodiment. The gas speed reducer 300 (400) comprises a first section 302 (402), and a second section 304 (404) connected to the first section 302 (402).

As illustrated in FIG. 3, the first section 302 is attached to the second section 304 at a 90 degree angle. Of course, the angle of the attachment is not limited to 90 degrees. In FIG. 4, the second section 404 is an angled section (shown at 90 degrees, but not limited thereto), such that the second section creates two channels. It should be understood by one of ordinary skill in the art that one or both sections 302, 304, 402, 404 may each include a single channel (as in FIG. 3), or multiple channel channels (as in FIG. 4).

In this embodiment, gas is directly injected into the gas inlets 306 (406). As the gas enters the gas speed reducer 300 (400), it is forced to follow the low conductance path formed by the channel. The gas then enters the plasma chamber 100 and interacts with the plasma discharge at a reduced speed. The typical dimensions of the gas speed reducer are smaller than the size of chamber 100.

While the gas speed reducers illustrated in FIGS. 3 and 4 feature particular values for the dimensions and disposition of the different parts of the channels, embodiments of the invention are not so limited. For example, the gas speed reducer may be composed of multiple channels. Also, as one of ordinary skill in the art would understand, other embodiments are possible where the channel is such that, when traveling through the channel, the center of the input and output holes of the channel can only be connected by a broken line.

Furthermore, first section and second section of the channels in FIG. 3 are formed from a single component. However, it is also contemplated that the first section and the second section may be separate components that are attached by a flange means, for example, or a welding process, for example.

Figure 5:
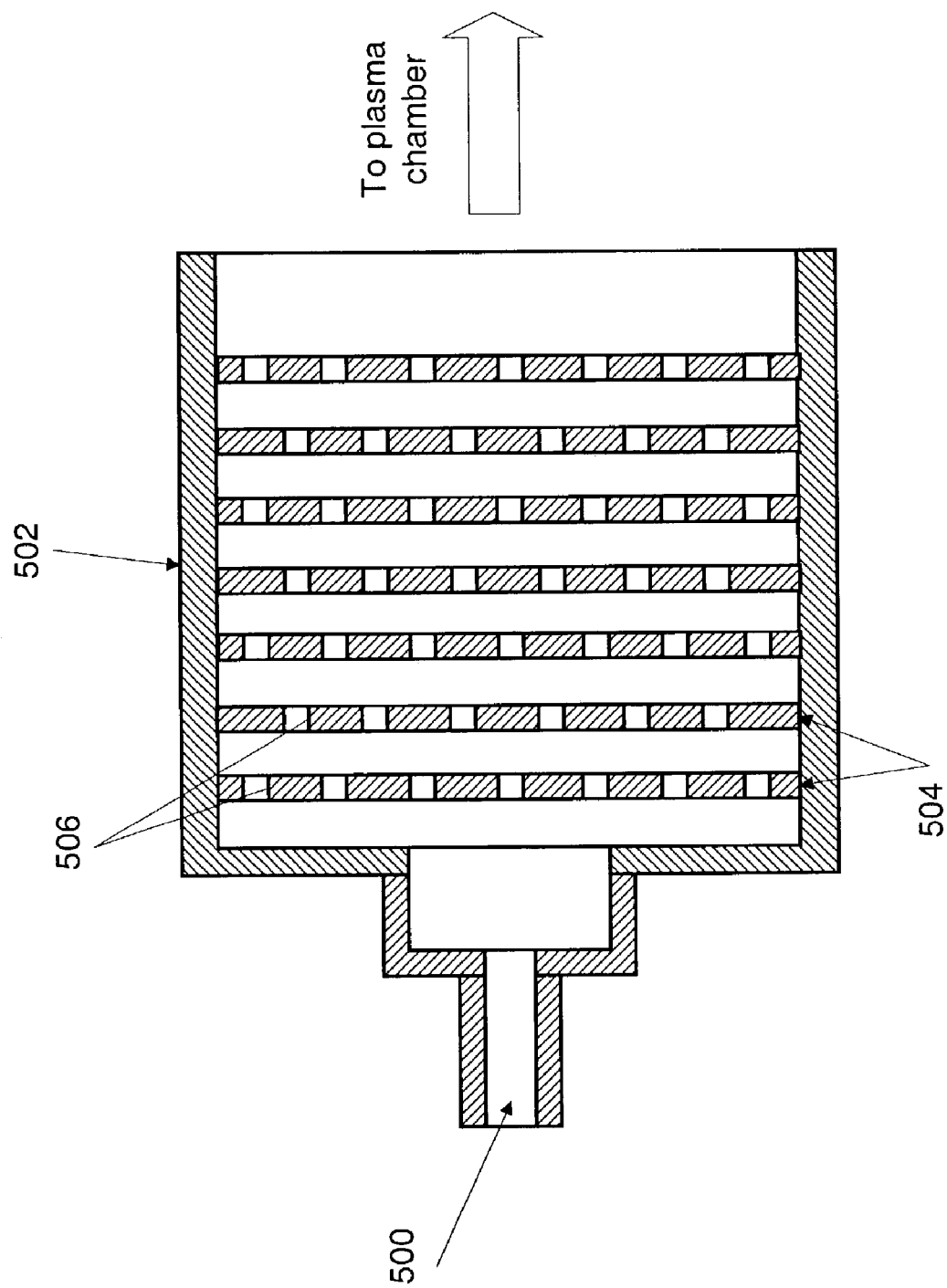
FIG. 5 illustrates a gas feed in accordance with a third embodiment of the invention.

FIG. 5 shows an example of a third embodiment of this invention. In this embodiment, the gas feed 102 comprises a gas speed reducer 502, which is made up of a stack of two or more perforated sheaths 504 arranged such that the holes 506 in consecutive sheaths are not aligned.

In this embodiment, gas is directly injected into the gas inlet 500. As the gas enters the gas speed reducer 502, it is forced to through a low conductance path formed by the stack of perforated sheaths 504. The gas then enters the plasma chamber 100 and interacts with the plasma discharge at a reduced speed.

3. General Matters

In the description above, for the purposes of explanation, numerous specific details are set forth in order to provide a thorough understanding of the present invention. It will be apparent, however, to one skilled in the art that the present invention may be practiced without some of these specific details. In other instances, well-known circuits, structures, devices, and techniques have been shown in block diagram form or without detail in order not to obscure the understanding of this description.

The present invention includes various steps, but steps can be added to or deleted from any of the methods and signal or messages can be added or subtracted from any of the described steps or control lines without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

Furthermore, while the invention has been illustrated in the context of a plasma chamber, the invention is not so limited. It can be applied to a great variety of fields where there is a need for a low gas conductance.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. A plasma source apparatus comprising:
   a) a plasma chamber for containing a plasma therein;
   b) a gas inlet disposed at a sidewall of the plasma chamber for injecting a working gas into the plasma chamber; and
   c) a gas speed reducer disposed at the gas inlet, the gas speed reducer enhancing the production of reaction products in the plasma chamber by reducing the speed at which the working gas interacts with the plasma, the gas speed reducer comprising a chamber having an open end connected to the gas inlet, a closed end, and a sidewall having at least one aperture through which the working gas is diffused into the plasma chamber.

2. The apparatus of claim 1, wherein the sidewall of the gas speed reducer is cylindrical.

3. A plasma source apparatus comprising:
   a) a plasma chamber for containing a plasma therein;
   b) a gas inlet disposed at a sidewall of the plasma chamber for injecting a working gas into the plasma chamber; and
   c) a gas speed reducer disposed at the gas inlet, the gas speed reducer enhancing the production of reaction products in the plasma chamber by reducing the speed at which the working gas interacts with the plasma, the gas speed reducer comprising serially connected gas flow channels that change the direction of the flow angle of the working gas a plurality of times.

4. The apparatus of claim 3 wherein the gas speed reducer comprises a plurality of perforated sheaths each having a plurality of holes through which the working gas flows, the plurality of holes in a first one of the perforated sheaths not aligning with the plurality of holes in an adjacent one of the perforated sheaths.

5. A method of injecting gas into a plasma source device comprising:
   a) providing a plasma chamber containing a plasma therein;
   b) providing a gas inlet for injecting a working gas into the plasma chamber; and
   c) enhancing the production of reaction products in the plasma chamber by reducing the speed at which the working gas interacts with the plasma, wherein the working gas speed is reduced using a chamber disposed at the gas inlet and having an open end connected to the gas inlet, a closed end, and a sidewall having at least one aperture through which the working gas is diffused into the plasma chamber.

6. The method of claim 5 wherein the sidewall is cylindrical.

7. The method of claim 5 wherein the direction of the flow angle of the working gas is changed a plurality of times.

8. The method of claim 5 wherein the working gas speed is reduced using a plurality of perforated sheaths each having a plurality of holes through which the working gas flows, the plurality of holes in a first one of the perforated sheaths not aligning with the plurality of holes in an adjacent one of the perforated sheaths.

* * * * *